United States Patent
Sim et al.

(10) Patent No.: US 10,928,432 B2
(45) Date of Patent: Feb. 23, 2021

(54) REVERBERATION CHAMBER

(71) Applicant: Electronics and Telecommunications Research Institute, Daejeon (KR)

(72) Inventors: Dong-Uk Sim, Daejeon (KR); Sang il Kwak, Daejeon (KR); Jong Hwa Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 228 days.

(21) Appl. No.: 16/167,302

(22) Filed: Oct. 22, 2018

(65) Prior Publication Data
US 2019/0339315 A1 Nov. 7, 2019

(30) Foreign Application Priority Data
May 2, 2018 (KR) ........................ 10-2018-0050827

(51) Int. Cl.
*G01R 29/08* (2006.01)
*G01R 31/00* (2006.01)

(52) U.S. Cl.
CPC ....... *G01R 29/0821* (2013.01); *G01R 31/001* (2013.01)

(58) Field of Classification Search
CPC .......................... G01R 29/0821; G01R 31/001
USPC ........................................... 455/67.11, 67.12
See application file for complete search history.

(56) References Cited

U.S. PATENT DOCUMENTS

| | | | |
|---|---|---|---|
| 6,885,265 B2 | 4/2005 | Li et al. | |
| 2009/0303141 A1* | 12/2009 | Kosdikian | .......... G01R 29/0821 343/703 |
| 2010/0099361 A1* | 4/2010 | Lundstrom | ........ H04B 17/3911 455/67.11 |
| 2012/0162001 A1 | 6/2012 | Sim | |
| 2013/0050006 A1 | 2/2013 | Sim | |
| 2015/0045635 A1* | 2/2015 | Tankiewicz | .......... A61B 5/0004 600/309 |

FOREIGN PATENT DOCUMENTS

KR 1020090075678 A 7/2009
KR 101442557 B1 9/2014

OTHER PUBLICATIONS

International Electrotechnical Commission, International standard "Electromagnetic Compatibility(EMC)—Part 4-21: Testing and measurement techniques—Reverberation chamber test methods", Jan. 2011, Edition 2.0IEC 61000-4-21, Geneva, Switzerland.

* cited by examiner

*Primary Examiner* — Ayodeji O Ayotunde
(74) *Attorney, Agent, or Firm* — William Park & Associates Ltd.

(57) ABSTRACT

Provided a reverberation chamber including a pair of a transmitting and receiving antenna and a reflection plate configured to reflect an electromagnetic wave output from the transmitting and receiving antenna to a working volume in a beam direction to improve a field uniformity of the working volume in the reverberation chamber and increase an applicability of the reverberation chamber.

18 Claims, 11 Drawing Sheets

REVERBERATION CHAMBER

CROSS-REFERENCE TO RELATED APPLICATION(S)

This application claims the priority benefit of Korean Patent Application No. 10-2018-0050827 filed on May 2, 2018, in the Korean Intellectual Property Office, the disclosure of which is incorporated herein by reference for all purposes.

BACKGROUND

1. Field

One or more example embodiments relate to a reverberation chamber and, more particularly, a reverberation chamber for improving a field uniformity in the reverberation chamber to increase a performance of the reverberation chamber.

2. Description of Related Art

With the development of information technology (IT), uses of electronic devices using wireless communication have rapidly increased in various frequency bands. As the use of wireless communication increases, a regulatory range that regulates an electromagnetic interference and a radiation tolerance of the wireless communication has been extended compared to the past. Accordingly, it is required to measure appropriate electromagnetic wave specifications for electronic devices that provide various services.

Recently, as a substitute facility for measuring the electromagnetic wave of electronic devices, technologies related to a definition and specification of a reverberation chamber and an application of an electromagnetic compatibility (EMC) have been studied. In general, an appearance of the reverberation chamber may be provided in a polyhedral shape as well as a rectangular parallelepiped shape, and the reverberation chamber may include at least one mode stirrer.

Also, the mode stirrer may be a significant element that determines a performance of the reverberation chamber. A method of evaluating an efficiency of the mode stirrer and a procedure of evaluating the performance of the reverberation chamber are described below. It can be known from the following description that physical parameters such as a shape, a size, a number, and an arranged position of the mode stirrer are significant variables for designing the reverberation chamber.

Accordingly, there is a desire for research to improve a field uniformity of the reverberation chamber by analyzing a standard deviation of a working volume based on an internal structure of the reverberation chamber.

SUMMARY

An aspect provides technology for arranging reflection plates in a reverberation chamber based on various structures to ensure a field uniformity in the reverberation chamber.

Another aspect also provides a method of improving a field uniformity to increase a performance of a reverberation chamber using reflection plates arranged in the reverberation chamber.

According to an aspect, there is provided a reverberation chamber including a mode stirrer including a plurality of metal panels, a transmitting and receiving antenna spaced apart by a predetermined distance from a working volume formed inside the reverberation chamber, and a reflection plate disposed between the working volume and the transmitting and receiving antenna, wherein the reflection plate and the transmitting and receiving antenna are configured as a pair, the reflection plate is spaced apart from one surface of the working volume, and the mode stirrer is at least one of a columnar mode stirrer in which a plurality of metal panels having a dual structure between a ceiling and a floor of the reverberation chamber is arranged to be connected, a ceiling-type mode stirrer in which a plurality of metal panels having a dual structure between wall surfaces of the reverberation chamber is arranged to be connected, a pyramidal fixed mode stirrer located on a wall surface of the reverberation chamber, and an uneven fixed mode stirrer disposed on a wall surface of the reverberation chamber in parallel with the pyramidal fixed mode stirrer, the wall surface being different from the wall surface on which the pyramidal fixed mode stirrer is located.

The transmitting and receiving antenna may be configured to emit an electromagnetic wave in a non-line-of-sight direction of the working volume of the reverberation chamber.

The reflection plate are configured to control a path of an electromagnetic field along which an electromagnetic wave occurring in the transmitting and receiving antenna is propagated to the working volume of the reverberation chamber.

At least one of a form, a size, a shape, and an arranged space of the reflection plate may be controlled in consideration of an eigenmode distribution of the reverberation chamber with respect to an empty space in the reverberation chamber based on a location of the working volume.

The eigenmode of the reverberation chamber may be changed by at least one of the columnar mode stirrer, the ceiling-type mode stirrer, the pyramidal fixed mode stirrer, and the uneven fixed mode stirrer.

The reflection plate may have a shape of one of a curved surface and a bent surface to reflect an electromagnetic wave occurring in the transmitting and receiving antenna.

A size of the reflection plate may be greater than a size of one surface of the working volume.

According to another aspect, there is also provided a reverberation chamber including a mode stirrer including a plurality of metal panels, transmitting and receiving antennas spaced apart by a predetermined distance from a working volume formed inside the reverberation chamber, and reflection plates disposed between the working volume and the transmitting and receiving antennas, wherein the reflection plates and the transmitting and receiving antennas are configured as pairs, respectively, the pairs are spaced apart from one surface of the working volume, and the mode stirrer is at least one of a columnar mode stirrer in which a plurality of metal panels having a dual structure between a ceiling and a floor of the reverberation chamber is arranged to be connected, a ceiling-type mode stirrer in which a plurality of metal panels having a dual structure between wall surfaces of the reverberation chamber is arranged to be connected, a pyramidal fixed mode stirrer located on a wall surface of the reverberation chamber, and an uneven fixed mode stirrer disposed on a wall surface of the reverberation chamber in parallel with the pyramidal fixed mode stirrer, the wall surface being different from the wall surface on which pyramidal fixed mode stirrer is located.

The reflection plates may be spaced apart from the one surface of the working volume by the same distance or different distances.

The reflection plates may be arranged on the same line in parallel, arranged to be offset from each other, arranged alternately, or arranged vertically with respect to the one surface of the working volume.

The reflection plates may be the same or different in size, and the reflection plates are greater or smaller in size than the one surface of the working volume.

According to still another aspect, there is also provided a reverberation chamber including a mode stirrer including a plurality of metal panels, transmitting and receiving antennas spaced apart by a predetermined distance from a working volume formed inside the reverberation chamber, and reflection plates disposed between the working volume and the transmitting and receiving antennas, wherein the reflection plates and the transmitting and receiving antennas are configured as pairs, respectively, the pairs are spaced apart from at least two surfaces of the working volume, and the mode stirrer is at least one of a columnar mode stirrer in which a plurality of metal panels having a dual structure between a ceiling and a floor of the reverberation chamber is arranged to be connected, a ceiling-type mode stirrer in which a plurality of metal panels having a dual structure between wall surfaces of the reverberation chamber is arranged to be connected, a pyramidal fixed mode stirrer located on a wall surface of the reverberation chamber, and an uneven fixed mode stirrer disposed on a wall surface of the reverberation chamber in parallel with the pyramidal fixed mode stirrer, the wall surface being different from the wall surface on which pyramidal fixed mode stirrer is located.

The same number or different numbers of the reflection plates may be arranged with respect to the at least two surfaces of the working volume.

When the pairs are arranged on one surface of the working volume, the reflection plates may be arranged on the same line in parallel, arranged to be offset from each other, arranged alternately, or arranged vertically.

When the pairs are arranged on one surface of the working volume, the reflection plates may be spaced apart from the one surface of the working volume by the same distance or different distances.

The reflection plates may be the same or different in size, and the reflection plates may be greater or smaller in size than one surface of the working volume.

The reflection plates may have a shape of one of a curved surface and a bent surface to reflect an electromagnetic wave occurring in the transmitting and receiving antenna, or include a slot of a predetermined shape.

A gradient at which the reflection plates are arranged in the reverberation chamber may be adjusted based on a distribution of electromagnetic waves represented by an eigenmode of the reverberation chamber.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
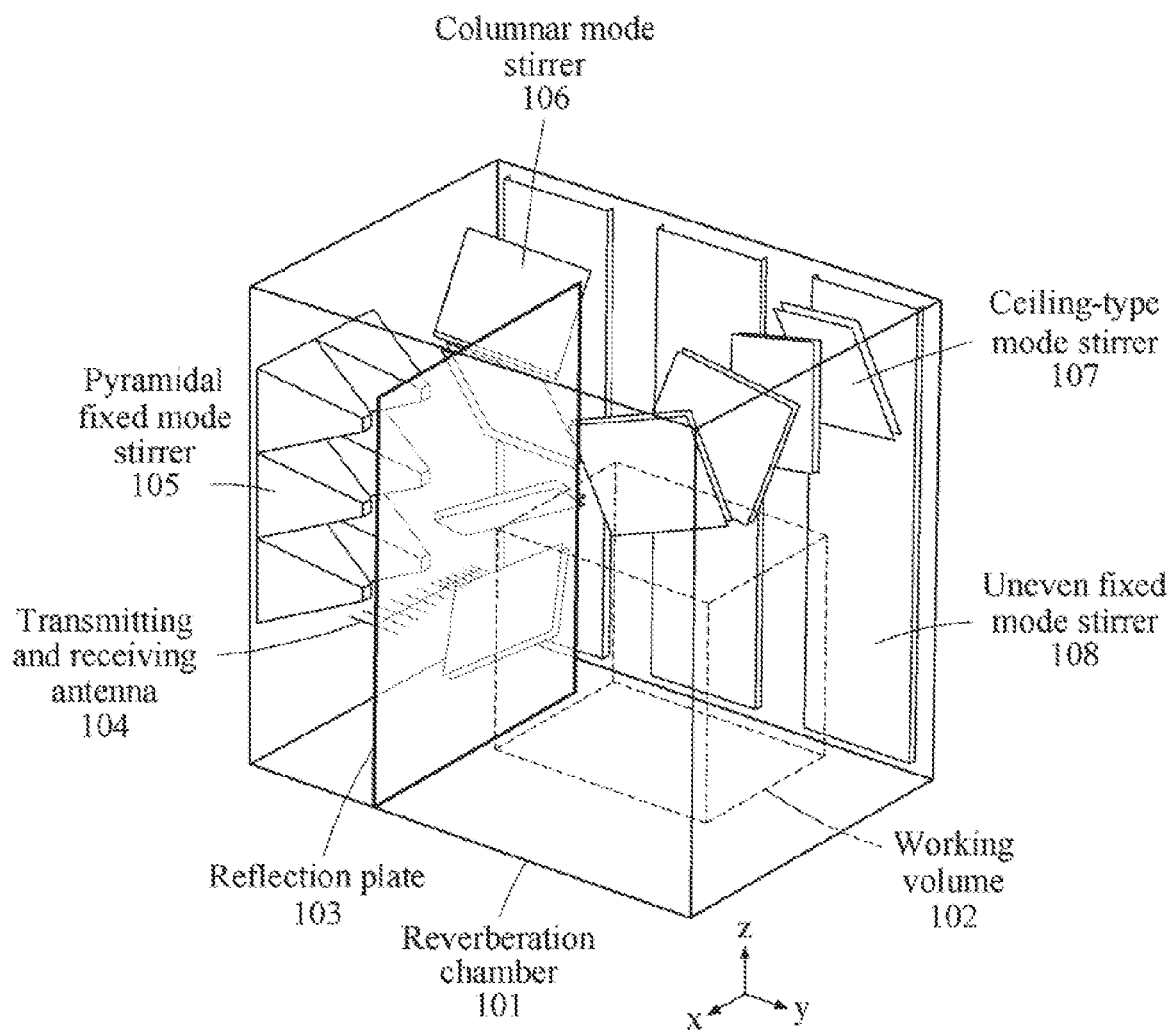
FIG. 1 is a diagram illustrating a structure of a reverberation chamber including a reflection plate according to an example embodiment.

Hereinafter, example embodiments will be described in detail with reference to the accompanying drawings. It should be understood, however, that there is no intent to limit this disclosure to the particular example embodiments disclosed. On the contrary, example embodiments are to cover all modifications, equivalents, and alternatives falling within the scope of the example embodiments.

The terminology used herein is for the purpose of describing particular embodiments only and is not intended to be limiting. As used herein, the singular forms "a," "an" and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

FIG. 1 is a diagram illustrating a structure of a reverberation chamber including a reflection plate according to an example embodiment.

Referring to FIG. 1, a reverberation chamber, for example, a reverberation chamber, 101 may be a substitute testing facility for measuring a performance of a wireless terminal device such as a smartphone and measuring an electromagnetic compatibility (EMC) such as an electromagnetic interference (EMI) disturbance and a radiation immunity. In order for the reverberation chamber 101 to be used as the substitute testing facility, a field uniformity in a working volume that is disposed therein may need to be maintained.

In the reverberation chamber 101, a working volume 102 of a rectangular parallelepiped where a measurement object is to be placed may be defined. Also, while at least one mode stirrer disposed in the reverberation chamber 101 makes one rotation at a preset interval or continuously, an electromagnetic field generated from a transmitting and receiving antenna 104 disposed in the reverberation chamber 101 may be measured at eight vertices of the working volume 102. After the measuring, a standard deviation calculated based on measured data may be used as a measure of a basic performance of the reverberation chamber 101.

Here, the standard deviation may indicate a field uniformity of the working volume 102 in the reverberation chamber 101. A standard deviation of an electromagnetic wave satisfying the basic performance of the reverberation chamber may be required to be 3 decibels (dB) or less in a general frequency range. As the standard deviation of the electromagnetic wave decreases, it is determined that field values measured in the working volume 102 of the reverberation chamber 101 may be more uniform. From this, it can be known that a deviation of values measured at a predetermined position in the working volume 102 is relatively small.

The field uniformity may have a significant effect on measurement uncertainty and reproducibility of a measured value when the measurement object in the reverberation chamber 101 is measured. In other words, the greater the field uniformity, the higher a probability that the measured value of a device to be measured is reproduced with a small deviation. In practice, in terms of a measurement evaluation of a wireless device such as the smartphone as well as the EMC measurement, the reproducibility may be s significant performance indicator for determining whether the reverberation chamber 101 is to be used as a measurement facility.

Thus, the present disclosure proposes a method to improve the field uniformity of the reverberation chamber 101 for increasing a reliability of the field uniformity of the reverberation chamber 101 even when the standard deviation of the electromagnetic wave is less than or equal to 3 dB. Improving the field uniformity of the reverberation chamber 101 may be important for improving a usability of the reverberation chamber 101.

An appearance of the reverberation chamber 101 may be provided in various polyhedral shapes. The appearance of the reverberation chamber 101 may be in, for example, a rectangular parallelepiped shape. When the appearance is in the rectangular parallelepiped shape, the rectangular parallelepiped may be represented with a floor, a ceiling, and four walls.

The mode stirrer in the reverberation chamber 101 may include at least one mode stirrer to improve the field uniformity. The mode stirrer may include at least one of a pyramidal fixed mode stirrer 105, a columnar mode stirrer 106, a ceiling-type anode stirrer 107, and an uneven fixed mode stirrer 108. The mode stirrer may reflect the electromagnetic wave.

Depending on a type of the mode stirrer, the mode stirrer may reflect the electromagnetic wave in a fixed state. Also, depending on a type of the mode stirrer, the mode stirrer may reflect the electromagnetic wave in a rotating state. For example, the columnar mode stirrer 106 and the ceiling-type mode stirrer 107 may reflect the electromagnetic wave in the rotating state, and the pyramidal fixed mode stirrer 105 and the uneven fixed mode stirrer 108 may reflect the electromagnetic wave in a state in which the pyramidal fixed mode stirrer 105 and the uneven fixed mode stirrer 108 are fixedly attached in the reverberation chamber. However, the present example is not to be taken as being limited thereto and thus, various embodiments related to the reflection of the electromagnetic wave are applicable.

The mode stirrer may include a plurality of metal panels that expresses various structures. The metal panel may be formed on a material capable of reflecting the electromagnetic wave such as metal, and may reflect the electromagnetic wave incident on the mode stirrer at various angles. For example, the metal panel may be formed of metal to reflect the electromagnetic wave incident on the mode stirrer.

The metal panel may be implemented as various structures. In order to reflect the electromagnetic wave at various angles, the metal panel may be in, for example, a plate shape, a pyramid structure, and a dual structure in which panels overlaps at preset intervals. However, the present example is not to be taken as being limited thereto and thus, various examples are applicable.

Metal panels included in the columnar mode stirrer 106 and the ceiling-type mode stirrer 107 may be arranged at different angles. Intervals bet centers of the metal panels may be the same or different. Also, sizes of the metal panels may be the same or different.

The metal panels of the columnar mode stirrer 106 may be connected by a metal column installed on a ceiling or a floor of the reverberation chamber 101. The metal panels of the ceiling-type mode stirrer 107 may be connected by a metal column installed on a wall of the reverberation chamber 101, and arranged to be adjacent to the ceiling of the reverberation chamber 101.

Values of physical parameters such as positions, sizes, shapes, and the number of mode stirrers may be determined in an optimization process for increasing a change in eigenmode in the reverberation chamber 101. Values of physical parameters such as sizes, shapes, intervals, and positions of the metal panels included in the mode stirrer may also be determined based on a similar principle.

The physical parameters such as positions of fire mode stirrer may be significant variables for improving the performance of the reverberation chamber 101. For example, the columnar mode stirrer 106 and the ceiling-type mode stirrer 107 may be arranged at determined positions so as to improve an electromagnetic wave uniformity.

The physical parameters such as the number of mode stirrers may be significant variables for improving the performance of the reverberation chamber 101. For example, the number of the columnar mode stirrer 106 and the number of the ceiling-type mode stirrer 107 may each be at least one.

The physical parameters such as the sizes of the panels included in the mode stirrer may be significant variables for improving the performance of the reverberation chamber 101. For example, the sizes of the panels included in the columnar mode stirrer 106 and the ceiling-type mode stirrer 107 may be the same or different.

The pyramidal fixed mode stirrer 105 and the uneven fixed mode stirrer 108 may be arranged at two different surfaces of the reverberation chamber 101. The pyramidal fixed mode stirrer 105 may include a pyramid-shaped metal panel. A size, a number, and a position of the pyramid-shaped metal panel may be determined so as to maximize the performance of the reverberation chamber 101. The pyramidal fixed mode stirrer 105 may reflect an internal electromagnetic wave of the reverberation chamber 101.

A size of the uneven fixed mode stirrer 108 including a plurality of panels may be adjusted based on a size of the reverberation chamber 101. The plurality of panels included in the uneven fixed mode stirrer 108 may be metal panels. The metal panels may be provided in various shapes including a shape of plate.

Various types of antennas, for example, a log-periodic dipole array (LPDA)-based transmitting and receiving antenna, a horn antenna, a patch antenna, and a dipole antenna may be used as the transmitting and receiving antenna 104. For example, the LPDA-based transmitting and receiving antenna may be used as the transmitting and receiving antenna 104. In this example, the transmitting and receiving antenna 104 may be spaced apart by a predetermined distance from the working volume 102 in the reverberation chamber 101. Also, a beam pattern direction may be arranged at a non-line-of-sight position of the working volume 102.

In order to improve the field uniformity of the reverberation chamber 101, a reflection plate 103 may be disposed between the transmitting and receiving antenna 104 and the working volume 102. The reflection plate 103 may control an electromagnetic field path along which an electromagnetic wave generated from the antenna is propagated to the working volume 102 in the reverberation chamber. In general, beam patterns of the transmitting and receiving antenna 104 may exist in the front, rear, and sides, and an intensity of beam output for each direction may be different. Even when the beam pattern of the transmitting and receiving antenna 104 is not toward the working volume 102, numerous paths including short paths and long paths for propagating the electromagnetic wave to the working volume 102 may exist in the reverberation chamber 101.

In order to increase the field uniformity of the working volume 102, it may be advantageous for the electromagnetic wave emitted from the transmitting and receiving antenna 104 to reach the working volume 102 through a lot of reflections and a sufficiently long path.

Therefore, in order to a goal of improving the field uniformity of the reverberation chamber 101, the reflection plate 103 may be provided to reflect the electromagnetic field from the transmitting and receiving antenna 104 directly toward the working volume 102. Also, a propagation path to the working volume may be designed to be complex and include a lot of reflections.

For example, a desirable size of the reverberation chamber 101 may be 1.4 meters (m)×1.95 m×1.85 m, a desirable size of the panel of the columnar mode stirrer 106 may be 0.46 m×0.46 m, and a desirable size of the panel of the ceiling-type mode stirrer 107 may be 0.40 m×0.40 m.

Figure 2A:
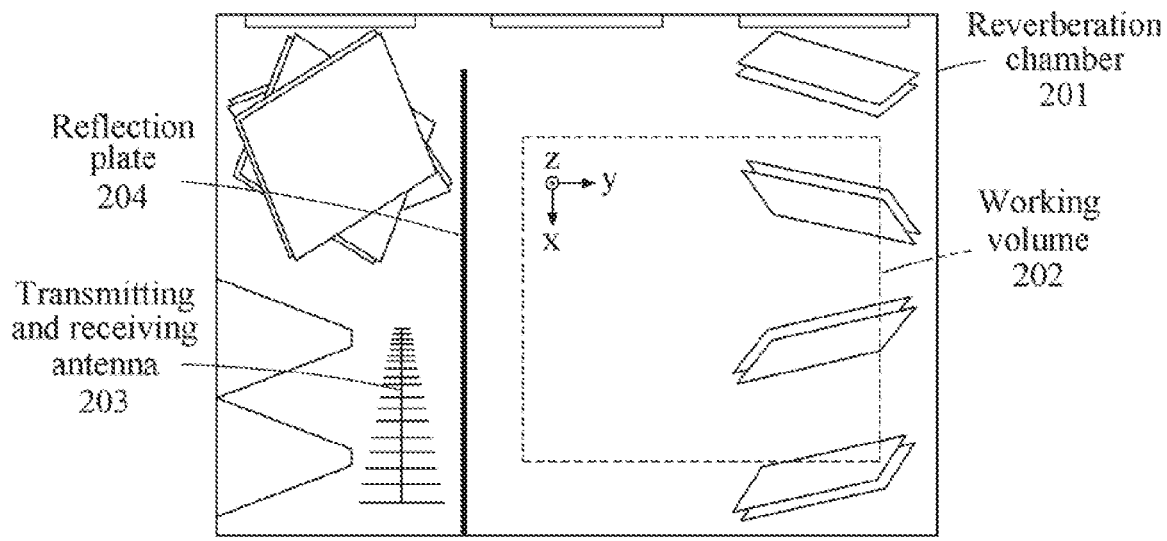
FIGS. 2A and 2B are a top view and a frontal view illustrating a reverberation chamber including a reflection plate according to an example embodiment.
Figure 2B:
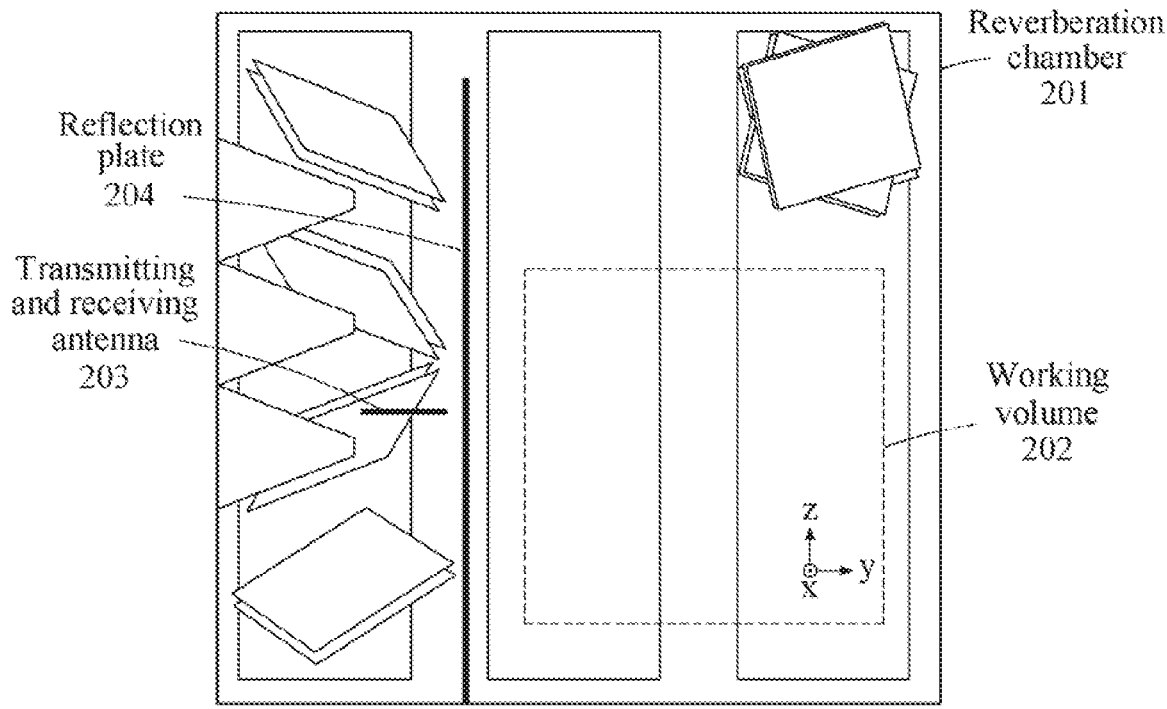

FIGS. 2A and 2B are a top view and a frontal view illustrating a reverberation chamber including a reflection plate according to an example embodiment.

FIG. 2A is a top view illustrating a reverberation chamber 201. In the reverberation chamber 201, a working volume 202 of a rectangular parallelepiped where a measurement object is to be placed may be defined. A transmitting and receiving antenna 203 may be disposed in the reverberation chamber 201 to measure a field uniformity of the reverberation chamber 201. The transmitting and receiving antenna 203 may be disposed in a direction in which at least one mode stirrer including a metal panel capable of reflecting an electromagnetic wave is installed. For example, the transmitting and receiving antenna 203 may be disposed such that an electromagnetic wave is output to a wall or a space in which a columnar mode stirrer or an uneven fixed mode stirrer is disposed.

The transmitting and receiving antenna 203 may be on a non-line of sight of the working volume 202. In this example, a reflection plate 204 may reflect a field from the transmitting and receiving antenna 203 directly toward the working volume 202, and allow a propagation path to the working volume 202 to be complex and include a lot of reflections.

FIG. 2B is frontal view illustrating the reverberation chamber 201. Referring to FIG. 2B, based on a position of the working volume 202, at least one of a form, a size, a shape, and an arranged space of the reflection plate 204 may be adjusted in a direction in which an eigenmode distribution of the reverberation chamber 201 with respect to an empty space in the reverberation chamber 201 is optimally changed.

The eigenmode of the reverberation chamber 201 may be changed by at least one of a columnar mode stirrer, a ceiling-type mode stirrer, a pyramidal fixed mode stirrer, and an uneven fixed mode stirrer.

The reflection plate 204 may be provided in a shape of one of a curved surface and a bent surface to reflect an electromagnetic wave occurring in the transmitting and receiving antenna 203, and related description will be provided with reference to FIG. 9. Also, a size of the reflection plate 204 may be set to be greater than a size of one surface of the working volume 202.

Figure 3:
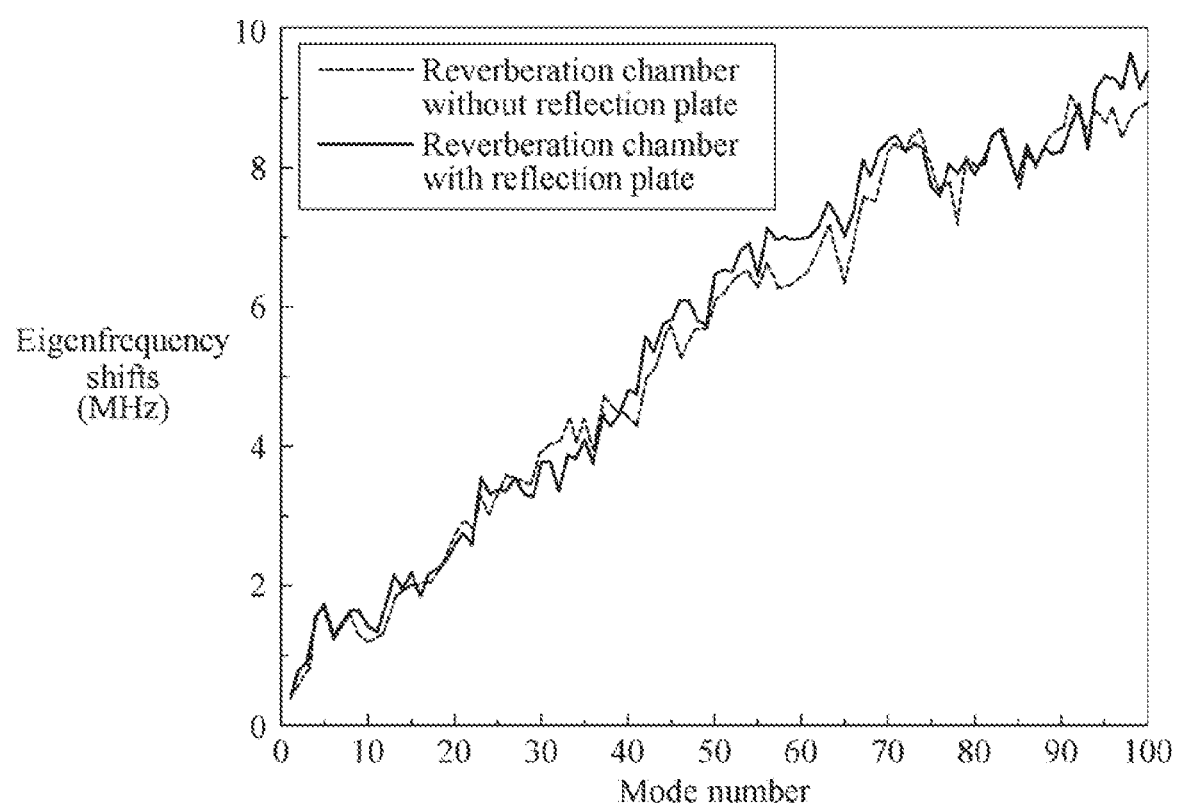
FIG. 3 is a graph illustrating an amount of change in an eigenmode distribution due to a presence of a mode stirrer and a reflected wave structure, based on an eigenmode distribution of a common empty cavity in each of a reverberation chamber including a reflection plate and a reverberation chamber not including a reflection plate according to an example embodiment.

FIG. 3 is a graph illustrating an amount of change in an eigenmode distribution due to a presence of a mode stirrer and a reflected wave structure, based on an eigenmode distribution of a common empty cavity in each of a reverberation chamber including a reflection plate and a reverberation chamber not including a reflection plate according to an example embodiment.

A reflection plate in a reverberation chamber may be configured based on various conditions of physical parameters such as shapes, sizes, and positions in consideration of positions of a transmitting and receiving antenna and a working volume in the reverberation chamber. Parameters associated with the reflection plate may be determined such that a standard deviation result with respect to an eigenmode distribution variation in the reverberation chamber is improved in comparison to a case in which the reflection plate is not used. In other words, the field uniformity may be improved by obtaining a lower standard deviation characteristic and, more fundamentally, increasing a variation of an eigenmode of when an internal structure change of the reverberation chamber is an empty cavity.

To verify effects of the present disclosure, simulations were performed under different conditions related to a size of the reflection plate in the reverberation chamber. The size of the reflection plate may be defined by an x-axial length*a z-axial length.

It can be known from the graph of FIG. 3 that, in comparison to the reverberation chamber not including the reflection plate, the reverberation chamber including the reflection plate causes a larger variation in an eigenmode distribution of an empty cavity. From this, it is indicated that the reverberation chamber including the reflection plate having a higher field uniformity for the electromagnetic wave when compared to the reverberation chamber not including the reflection plate. Thus, the reverberation chamber including the reflection plate may have an excellent performance.

In the example embodiment, the reflection plate may have a size of 1.3 m×0.72 m. Also, the graph of FIG. 3 shows that a variation of the eigenmode frequency has increased in most mode numbers except for a portion of the mode numbers represented on an x axis. This result may indicate that, even though the result is not an optimal result obtained under numerous conditions related to the size or shape of the reflection plate, the field uniformity of the reverberation chamber is improved by including the reflection plate.

Figure 4:
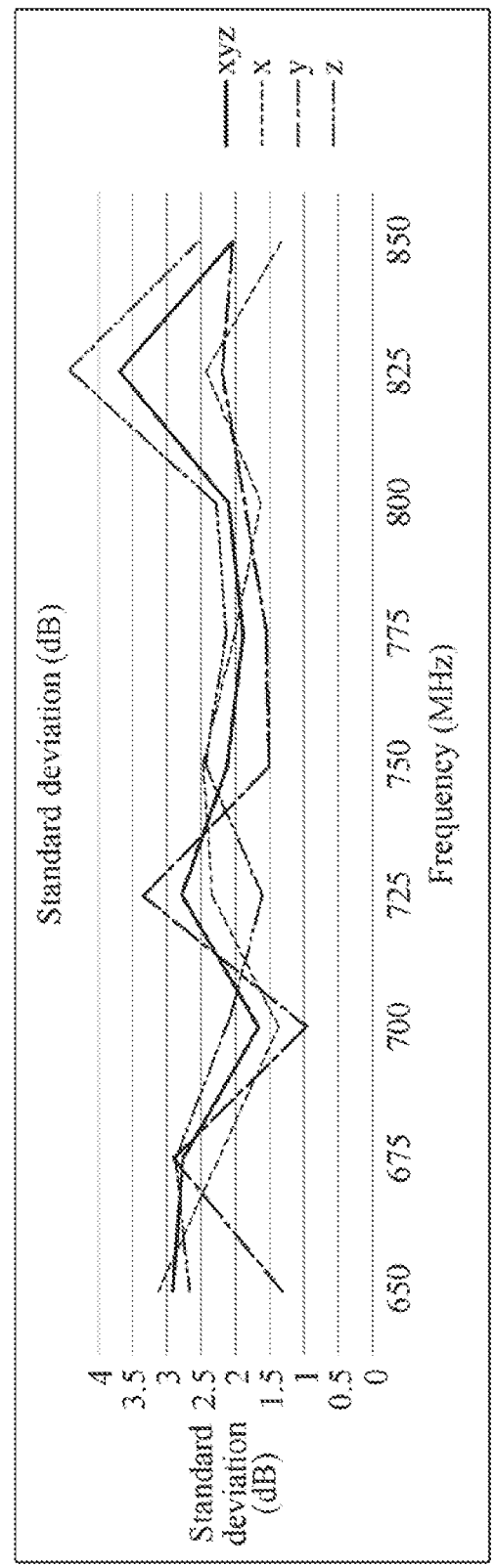
FIG. 4 is a graph illustrating a standard deviation performance of a working volume based on an eigenmode distribution in a reverberation chamber not including a reflection plate according to an example embodiment.

FIG. 4 is a graph illustrating a standard deviation performance of a working volume based on an electromagnetic field distribution expressed by an eigenmode in a reverberation chamber that does not include a reflection plate according to an example embodiment.

The graph of FIG. 4 represents a standard deviation performance of a reverberation chamber that does not include a reflection plate due to a distribution change based on an eigenmode of the reverberation chamber. A field uniformity of the reverberation chamber that does not include the reflection plate may not be averaged over all frequencies and have a relatively high standard deviation.

Figure 5:
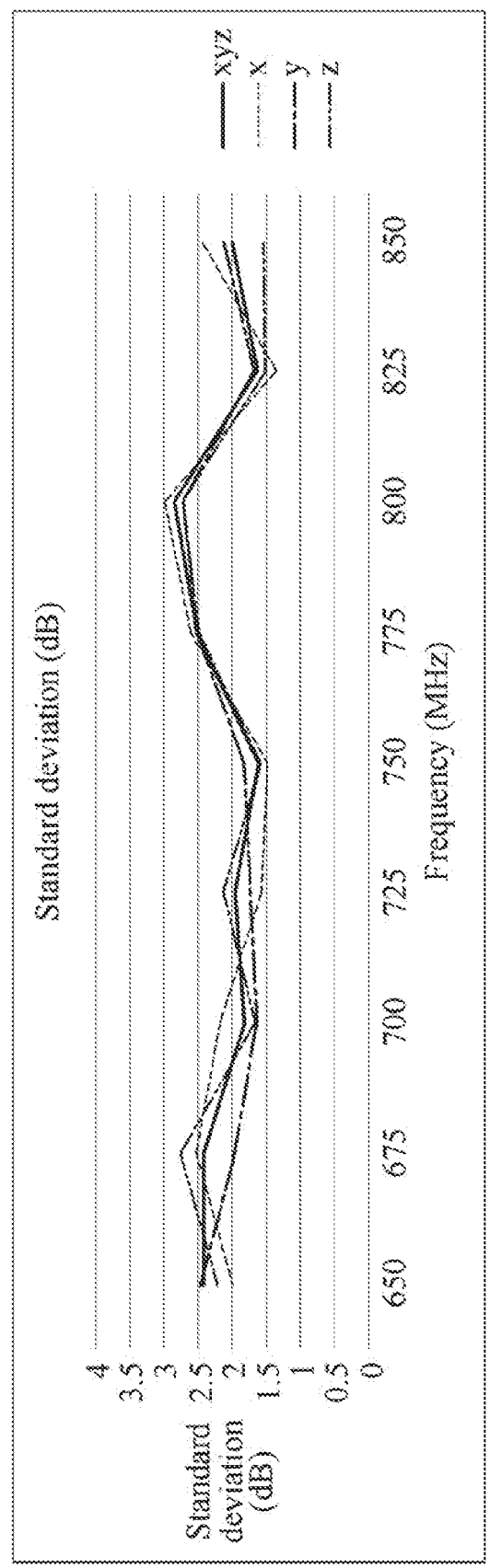
FIG. 5 is a graph illustrating a standard deviation performance of a working volume based on an eigenmode distribution in a reverberation chamber including a reflection plate according to an example embodiment.

FIG. 5 is a graph illustrating a standard deviation performance of a working volume based on an electromagnetic wave distribution indicated by an eigenmode in a reverberation chamber including a reflection plate according to an example embodiment.

The graph of FIG. 5 represents a standard deviation performance of a reverberation chamber including a reflection plate based on a distribution change according to an eigenmode of the reverberation chamber. In FIG. 5, a simulation were performed under the same condition as that of the reverberation chamber that does not include the reflection plate as described with reference to FIG. 4. In this simulation, a frequency in the reverberation chamber not including the reflection plate may have a performance less than 3 dB and a deviation between standard deviation elements for each frequency may also be decreased.

As a result, the field uniformity of the reverberation chamber including the reflection plate has been improved in comparison to the field uniformity of the reverberation chamber not including the reflection plate.

Figure 6:
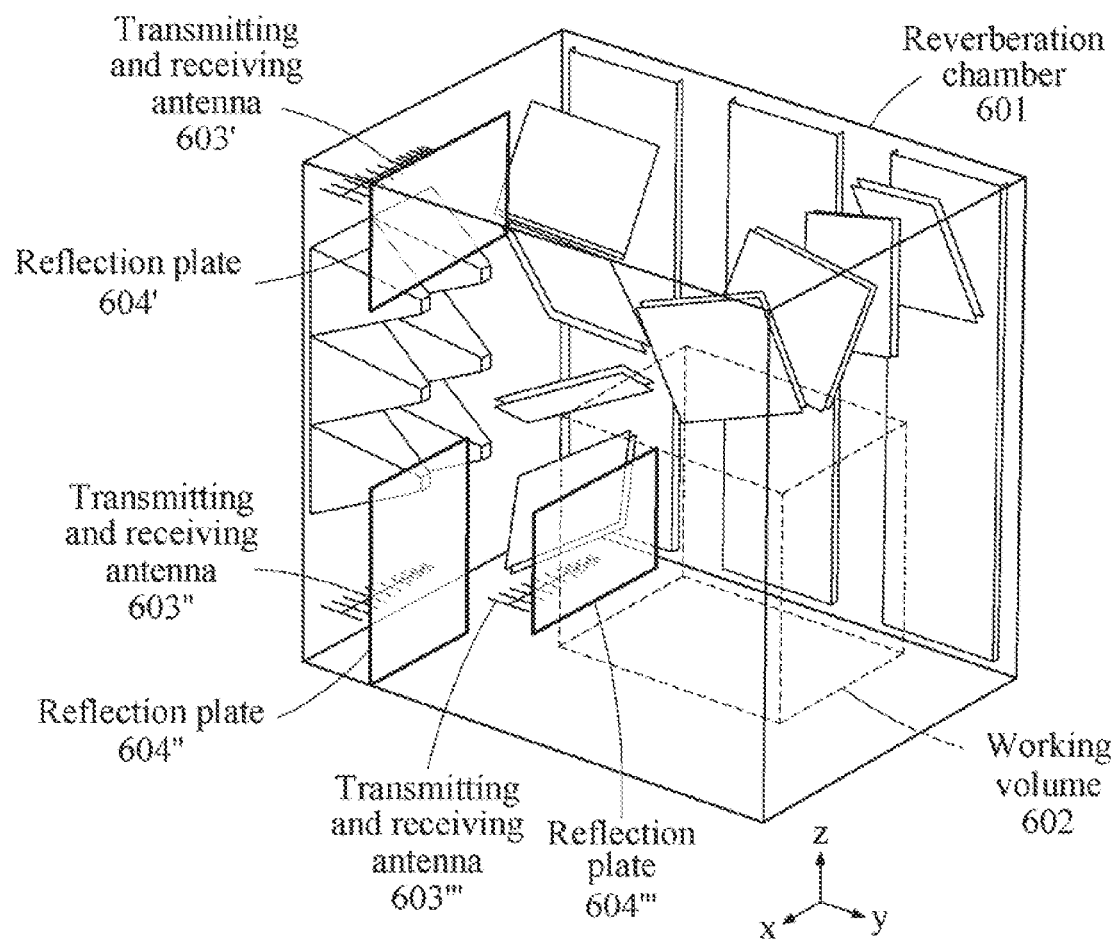
FIG. 6 is a diagram illustrating a structure of a reverberation chamber including a reflection plate according to an example embodiment.

FIG. 6 is a diagram illustrating a structure of a reverberation chamber including a reflection plate according to an example embodiment.

Referring to FIG. 6, a reverberation chamber 601 may include a plurality of transmitting and receiving antennas and a plurality of reflection plates. For example, when a plurality of transmitting and receiving antennas is used in the reverberation chamber 601, transmitting and receiving antennas 603', 603", and 603'" may be arranged to correspond to reflection plates 604', 604", and 604'" in a pairwise manner. That is, the transmitting and receiving antennas 603', 603", and 603'" may be arranged for the reflection plates 604', 604", and 604'", respectively. Such characteristic may be efficiently applied when a large reflector is not arrangeable.

A plurality of pairs of the transmitting and receiving antennas 603', 603", and 603'" and the reflection plates 604', 604", and 604'" may be arranged to be spaced apart from one side of a working volume 602. For example, the working volume 602 may be provided in a rectangular shape. When the working volume 602 has the rectangular shape, the working volume 602 may be expressed by a floor, a ceiling, a first wall, a second wall, a third wall, and a fourth wall.

The transmitting and receiving antennas 603', 603", and 603'" may be arranged at a position for improving a field uniformity in an optimization process for increasing an eigenmode change in the reverberation chamber. Also, the transmitting and receiving antennas 603', 603", and 603'" may be arranged to be spaced apart from one of sides, for example, the ceiling, the first wall, the second wall, the third wall, and the fourth wall other than the floor of the working volume 602.

The transmitting and receiving antennas 603', 603", and 603'" may be arranged at various positions such as the ceiling, the floor, and the walls in the reverberation chamber. The reflection plates 604', 604", and 604'" may be arranged to correspond to the transmitting and receiving antennas 603', 603", and 603'" arranged at one side of the working volume 602 in a pairwise manner. Also, the transmitting and receiving antennas 603', 603", and 603'" and the reflection plates 604', 604", and 604'" may be arranged in an order of "reflection plate—antenna" based on the one side of the working volume 602. The reflection plate may be disposed between the transmitting and receiving antenna and the working volume 602 to block movement of an electromagnetic wave between the transmitting and receiving antenna and the working volume 602.

An inclination of the reflection plates 604', 604", and 604'" arranged in the reverberation chamber may be adjusted based on an electromagnetic wave distribution expressed by the eigenmode of the reverberation chamber. In other words, the inclination of the reflection plates 604', 604", and 604'" arranged in the reverberation chamber may be adjusted to directly block the electromagnetic wave output to the working volume 602 based on a beam direction and an arrangement angle of the transmitting and receiving antennas 603', 603", and 603'".

When the transmitting and receiving antennas 603', 603", and 603'" are arranged in the reverberation chamber, the transmitting and receiving antennas 603', 603", and 603'" and the reflection plates 604', 604", and 604'" may be 1) arranged on the same line in parallel, 2) arranged to be offset from each other, 3) arranged alternately, or 4) arranged in a vertical direction. Related description will be made with reference to FIGS. 7A through 7D.

FIGS. 7A through 7D are diagrams illustrating positions at which a transmitting and receiving antenna and a reflection plate are arranged based on a working volume in a reverberation chat according to an example embodiment.

Referring to FIGS. 7A through 7D, a plurality of reflection plates may be arranged in a reverberation chamber. Reflection plates 704' and 704" may be 1) arranged on the same line in parallel, 2) arranged to be offset from each other, 3) arranged alternately, or 4) arranged in a vertical direction.

Figure 7A:
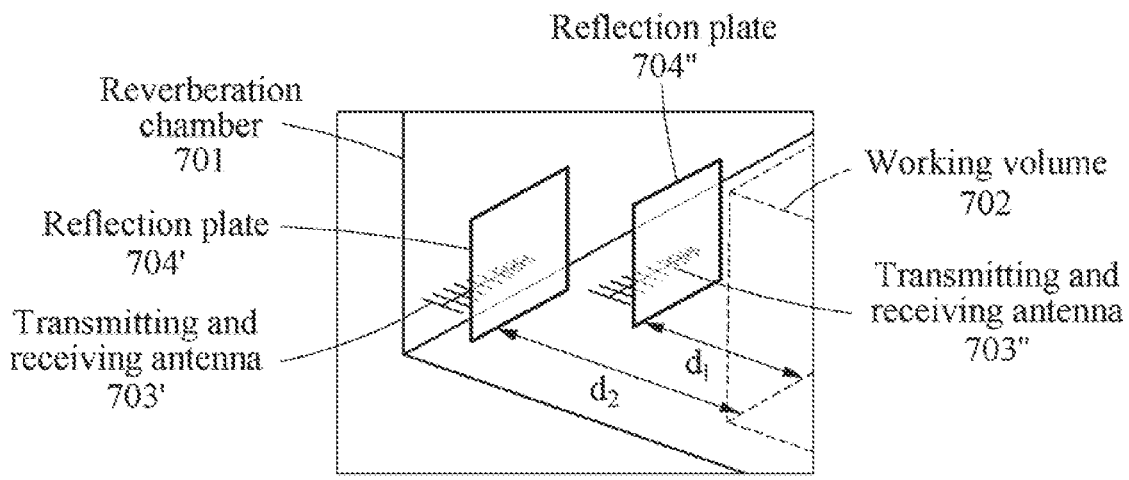
FIGS. 7A through 7D are diagrams illustrating positions at which a transmitting and receiving antenna and a reflection plate are arranged based on a working volume in a reverberation chamber according to an example embodiment.

Referring to FIG. 7A, the reflection plates 704' and 704" may be arranged to be offset from each other based on one side of a working volume 702. For example, the reflection plates 704' and 704" may be arranged in the working volume 702 based on positions of transmitting and receiving antennas 703' and 703" arranged in a reverberation chamber 701. In this example, the transmitting and receiving antennas 703' and 703" may be arranged at positions differing based on a position and a direction of an electromagnetic wave output to a mode stirrer. The reflection plates 704' and 704" may be arranged based on the differing positions of the transmitting and receiving antennas 703' and 703".

The reflection plates 704' and 704" may be arranged to be offset from each other instead of being arranged on the same line in the reverberation chamber. The reflection plates 704' and 704" may be spaced apart by difference distances from the one side of the working volume 702. For example, the reflection plate 704' may be spaced apart by a distance d2 from the one side of the working volume 702, and the reflection plate 704" may be spaced apart by a distance d1 from the one side of the working volume 702. In this example, the distance d1 may be less than the distance d2.

Figure 7B:
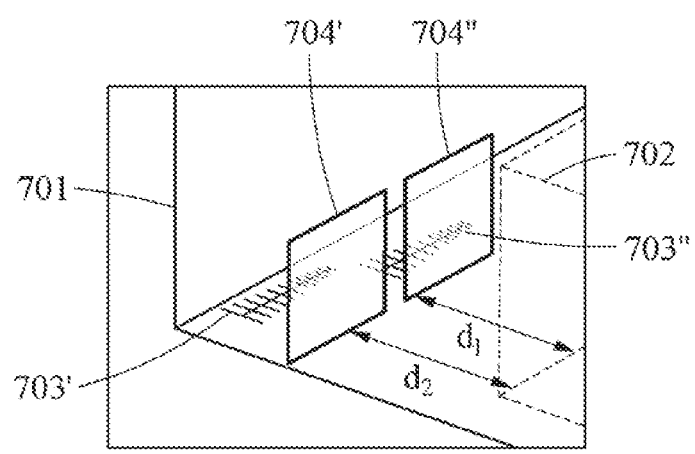

Referring to FIG. 7B, the reflection plates 704' and 704" may be arranged on the same line in parallel based on one side of the working volume 702. In FIG. 7B, a distance d1 from the reflection plate 704' to the one side of the working volume 702 may be the same as a distance d2 from the reflection plate 704" to the one side of the working volume 702.

Figure 7C:
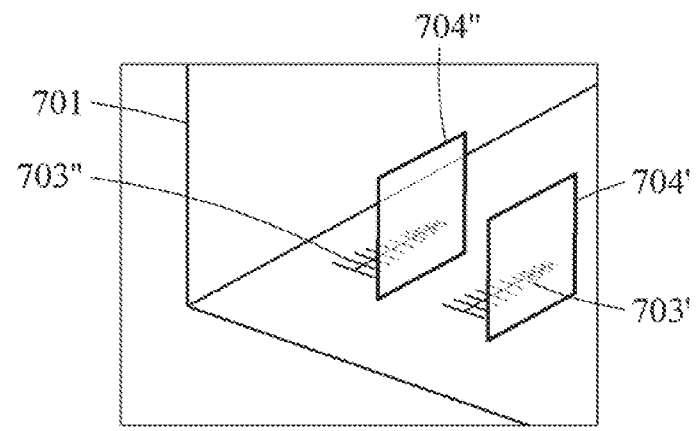

Referring to FIG. 7C, the reflection plates 704' and 704" may be arranged alternately based on one side of the working volume 702. For example, the reflection plates 704' and 704" and the transmitting and receiving antennas 703' and 703" may be formed to be pairs such that the pairs are alternately arranged.

Figure 7D:
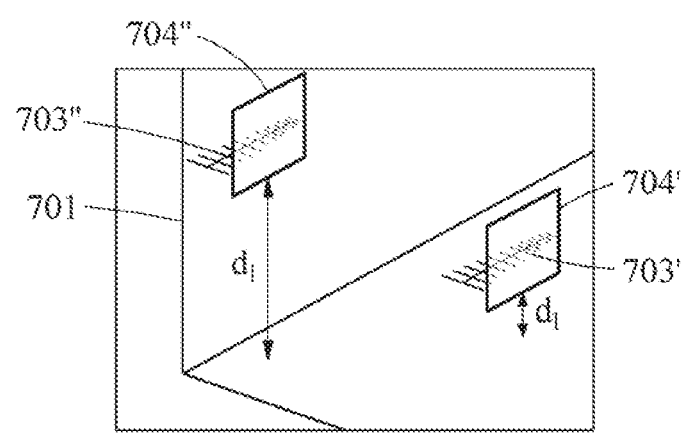

Referring to FIG. 7D, the reflection plates 704' and 704" may be arranged in different spaces based on one side of the working volume 702. For example, based on the one side of the working volume 702, the transmitting and receiving antenna 703' may be disposed adjacent to a floor surface of the reverberation chamber, and the transmitting and receiving antenna 703" may be disposed adjacent to a ceiling surface of the reverberation chamber. The reflection plate 704' may be disposed between the one side of the working volume 702 and the transmitting and receiving antenna 703' disposed adjacent to the floor surface. The reflection plate 704" may be disposed between the one side of the working volume 702 and the transmitting and receiving antenna 703" disposed adjacent to the ceiling surface.

The present disclosure may also be expressed in a combination of the aforementioned arrangement forms of the reflection plates. For example, the reflection plates may be arranged on the same line in parallel so that the positions of the reflection plates are adjacent to the ceiling surface and the floor surface, respectively.

Figure 8:
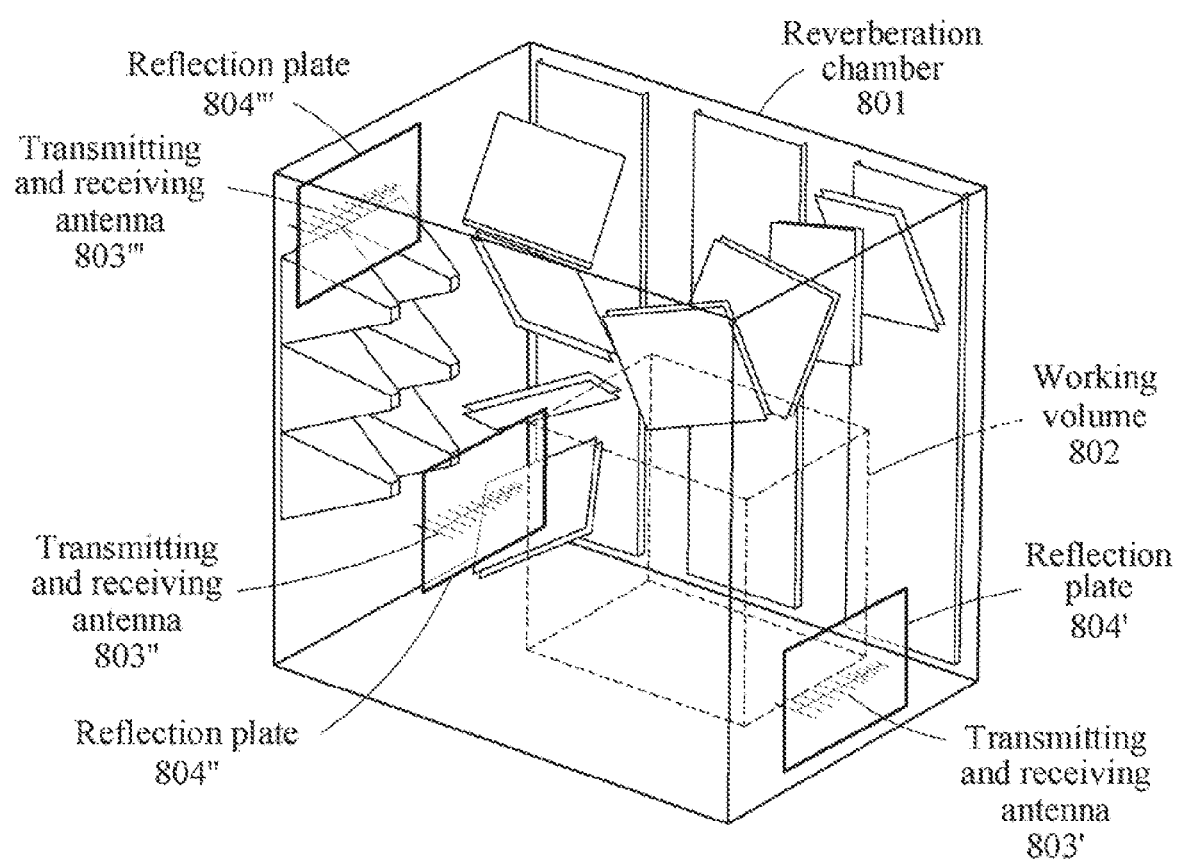
FIG. 8 is a diagram illustrating a structure of a reverberation chamber including a reflection plate according to an example embodiment.

FIG. 8 is a diagram illustrating a structure of a reverberation chamber including a reflection plate according to an example embodiment.

Referring to FIG. 8, a reverberation chamber 801 may include a plurality of transmitting and receiving antennas and a plurality of reflection plates. For example, when a plurality of transmitting and receiving antennas is used in the reverberation chamber 801, transmitting and receiving antennas 803', 803", and 803'" may be arranged to correspond to reflection plates 804', 804", and 804'" in a pairwise manner. That is, the transmitting and receiving antennas 803', 803", and 803'" may be arranged for the reflection plates 804', 804", and 804'", respectively.

A plurality of pairs of the transmitting and receiving antennas 803', 803", and 803'" and the reflection plates 804', 804", and 804'" may be arranged to be spaced apart from at least two sides of a working volume 802. For example, the working volume 802 may be provided in a rectangular shape. When the working volume 802 has the rectangular shape, the working volume 802 may be expressed by a floor, a ceiling, a first wall, a second wall, a third wall, and a fourth wall.

The transmitting and receiving antennas 803', 803", and 803'" may be arranged at a position for improving a field uniformity in an optimization process for increasing an eigenmode change in the reverberation chamber. Also, the transmitting and receiving antennas 803', 803", and 803'" may be arranged to be spaced apart from at least two of sides, for example, the ceiling, the first wall, the second wall, the third wall, and the fourth wall other than the floor of the working volume 802.

The transmitting and receiving antennas 803', 803", and 803'" may be arranged at various positions such as the ceiling, the floor, and the walls in the reverberation chamber. The reflection plates 804', 804", and 804'" may be arranged to correspond to the transmitting and receiving antennas 803', 803", and 803'" arranged on at least two sides of the working volume 802 in a pairwise manner.

The same or different numbers of transmitting and receiving antennas and reflection plates may be arranged on at least two sides of the working volume 802. For example, the transmitting and receiving antennas 803'" and 803" are arranged from a first wall of the working volume and the transmitting and receiving antenna 803' is arranged from a third wall of the working volume, the number of transmitting and receiving antennas, that is, the transmitting and receiving antennas 803'" and 803" arranged from the first wall of the working volume may be different from the number of transmitting and receiving antennas, that is, the transmitting and receiving antenna 803' arranged from the third wall of the working volume. Also, when a transmitting and receiving antenna (not shown) is arranged from the third wall of the working volume, the number of transmitting and receiving antennas and the number of reflection plates arranged on at least two sides of the working volume 802 may be the same. Thus, to improve the field uniformity of the reverberation chamber, a pair of a transmitting and receiving antenna and a reflection plate may be arranged at various positions based on a working volume.

The reflection plates 804', 804", and 804'" may be individually arranged for each of the transmitting and receiving antennas 803', 803", and 803'" arranged on at least two sides of the working volume 802. In this example, the transmitting and receiving antennas 803', 803", and 803'" and the reflection plates 804', 804", and 804'" may be arranged in an order of "reflection plate—antenna" based on one side of the working volume 802. The reflection plate may be disposed between the transmitting and receiving antenna and the working volume 802 to block movement of an electromagnetic wave between the transmitting and receiving antenna and the working volume 802.

An inclination of the reflection plates 804', 804", and 804'" arranged in the reverberation chamber may be adjusted based on an electromagnetic wave distribution expressed by the eigenmode of the reverberation chamber. In other words, the inclination of the reflection plates 804', 804", and 804'" arranged in the reverberation chamber may be adjusted to directly block the electromagnetic wave output to the working volume 802 based on a beam direction and an arrangement angle of the transmitting and receiving antennas 803', 803", and 803'".

When the transmitting and receiving antennas 803', 803", and 803'" are arranged in the reverberation chamber, the transmitting and receiving antennas 803', 803", and 803'" and the reflection plates 804', 804", and 804'" may be 1) arranged on the same line in parallel, 2) arranged to be offset from each other, 3) arranged alternately, or 4) arranged in a vertical direction. Related description are made with reference to FIGS. 7A through 7D.

FIGS. 9A through 9D are diagrams illustrating shapes of a reflection plate according to an example embodiment.

Referring to FIGS. 9A through 9D, reflection plates may be implemented in various forms to provide a similar or greater effect. The reflection plate may have a surface for varying a reflection angle of an electromagnetic wave output from a transmitting and receiving antenna and include slots of various shapes. Based on the various shapes of the reflection plate, a hybrid mode may be generated from an eigenmode distribution of a reverberation chamber not including the reflection plate. Through this, a large variation of the eigenmode of the reverberation chamber including the reflection plate may be deducted, which may result in an improved field uniformity.

Referring to FIG. 94, a reflection plate may be provided in a general planar shape. The reflection plate in the planar shape may reflect an electromagnetic wave output from a transmitting and receiving antenna in a direction opposite to a direction in which the electromagnetic wave is incident. In this example, the reflected electromagnetic wave may appear as a straight line.

Figure 9A:
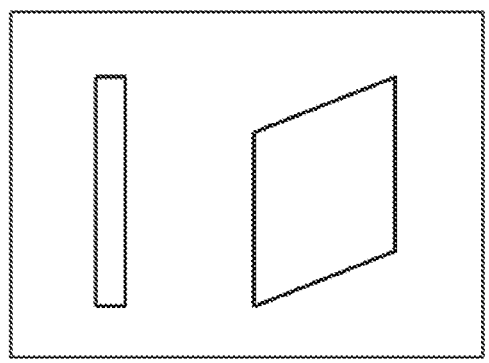
FIGS. 9A through 9D are diagrams illustrating shapes of a reflection plate according to an example embodiment.
Figure 9B:
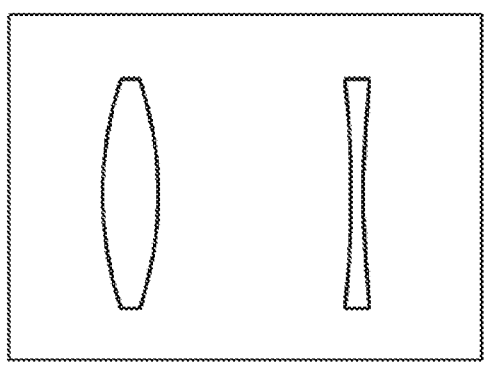
Figure 9C:
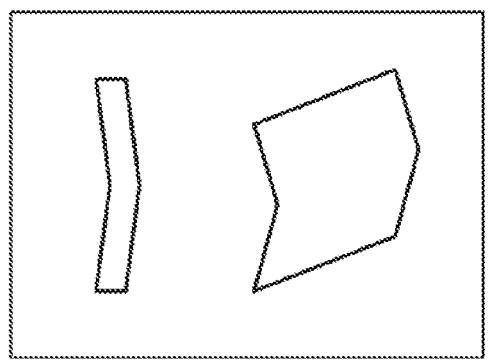
Figure 9D:
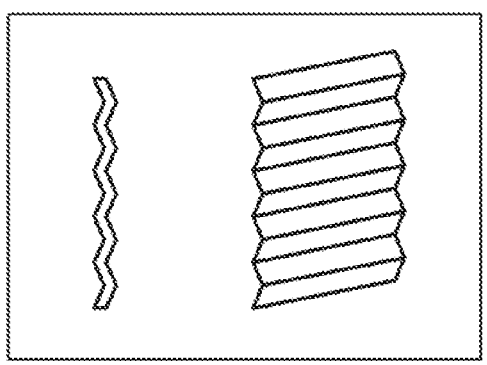

Referring to FIG. 9B, a reflection plate may be provided in a curved shape. In this example, the curved shape may be embodied as a concave line or a convex line. Referring to FIG. 9C, a reflection plate may be provided in a bent shape. Referring to FIG. 9D, a reflection plate may be provided in a zigzag shape. The reflection plates implemented by the shapes of FIGS. 9C through 9D may allow a lot of reflections and a relatively long path to be induced in the reverberation chamber by reflecting the electromagnetic wave output from the transmitting and receiving antenna at different angles based on the direction in which the electromagnetic wave is incident.

Although not shown in FIGS. 9A through 9D, in addition to the shapes of FIGS. 9A through 9D, the reflection plate may also be implemented in a form including a predetermined shape of slot. Specifically, incident and reflection of the electromagnetic wave may be performed in various ways depending on a structure, that is, a shape of the reflection plate disposed in the reverberation chamber. In order to diversify a reflection effect of the electromagnetic wave by the reflection plate, a predetermined shape of slot may be formed in the reflection plate. The slot may be provided in various shapes including a circle, a triangle, and a square. Also, a portion of the reflection plate may be penetrated by the predetermined shape of slot.

The reflection plate having the slot may be disposed between a working volume and a transmitting and receiving antenna in the reverberation chamber such that the electromagnetic wave generated from the transmitting and receiving antenna is not directly incident on the working volume.

As such, by reflecting the electromagnetic wave generated from the transmitting and receiving antenna using the reflection plate having the slot, an effect of reflecting the electromagnetic wave in more various directions and angles when compared to the reflection plate implemented as the planar shape may be provided.

According to example embodiments, it is possible to improve a field uniformity performance of a reverberation chamber by reducing a standard deviation of a working volume in the reverberation chamber using a structure and method for increasing variation of an eigenmode frequency distribution of the reverberation chamber based on a performance evaluation method and a configuration of the reverberation chamber proposed in the international standard, the International Electrotechnical Commission (IEC) 61000-4-21.

According to example embodiments, it is possible to improve a reliability of a reverberation chamber by increasing a reproducibility and reducing an uncertainty of a measurement result of the reverberation chamber when evaluating a performance of a wireless device such as a smartphone and performing an EMC measurement.

According to example embodiments, it is possible to increase a working volume of a reverberation chamber by reducing a field uniformity, that is, a standard deviation of the working volume when compared to a same-sized reverberation chamber with a typical standard deviation. Also, when a size of the working volume is fixed, an overall size of the reverberation chamber may be reduced.

According to example embodiments, it is possible to realize a high-performance reverberation chamber that is smaller than a typical reverberation chamber.

The components described in the exemplary embodiments of the present invention may be achieved by hardware components including at least one DSP (Digital Signal Processor), a processor, a controller, an ASIC (Application Specific Integrated Circuit), a programmable logic element such as an FPGA (Field Programmable Gate Array), other electronic devices, and combinations thereof. At least some of the functions or the processes described in the exemplary embodiments of the present invention may be achieved by software, and the software may be recorded on a recording medium. The components, the functions, and the processes described in the exemplary embodiments of the present invention may be achieved by a combination of hardware and software.

The processing device described herein may be implemented using hardware components, software components, and/or a combination thereof. For example, the processing device and the component described herein may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will be appreciated that a processing device may include multiple processing elements and/or multiple types of processing elements. For example, a processing device may include multiple processors or a processor and a controller. In addition, different processing configurations are possible, such as parallel processors.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A reverberation chamber comprising:
   a mode stirrer including a plurality of metal panels;
   a transmitting and receiving antenna spaced apart by a predetermined distance from a working volume formed inside the reverberation chamber; and
   a reflection plate disposed between the working volume and the transmitting and receiving antenna, wherein the reflection plate and the transmitting and receiving antenna are configured as a pair, each component of the pair being separated from each other,
   wherein the reflection plate is spaced apart from one surface of the working volume and formed in consideration of an eigenmode distribution of the reverberation chamber with respect to an empty space in the reverberation chamber based on a location of the working volume,
   and the mode stirrer is at least one of:
      a columnar mode stirrer in which a plurality of metal panels having a dual structure between a ceiling and a floor of the reverberation chamber is arranged to be connected;
      a ceiling-type mode stirrer in which a plurality of metal panels having a dual structure between wall surfaces of the reverberation chamber is arranged to be connected; a pyramidal fixed mode stirrer located on a wall surface of the reverberation chamber; and
      an uneven fixed mode stirrer disposed on a wall surface of the reverberation chamber in parallel with the pyramidal fixed mode stirrer, the wall surface being different from the wall surface on which the pyramidal fixed mode stirrer is located.

2. The reverberation chamber of claim 1, wherein the transmitting and receiving antenna is configured to emit an electromagnetic wave in a non-line-of-sight direction of the working volume of the reverberation chamber.

3. The reverberation chamber of claim 1, wherein the reflection plate is configured to control a path of an electromagnetic field along which an electromagnetic wave occurring in the transmitting and receiving antenna is propagated to the working volume of the reverberation chamber.

4. The reverberation chamber of claim 1, wherein at least one of a form, a size, a shape, and an arranged space of the reflection plate is controlled in consideration of the eigenmode distribution of the reverberation chamber with respect to the empty space in the reverberation chamber based on the location of the working volume.

5. The reverberation chamber of claim 4, wherein the eigenmode of the reverberation chamber is changed by at least one of the columnar mode stirrer, the ceiling-type mode stirrer, the pyramidal fixed mode stirrer, and the uneven fixed mode stirrer.

6. The reverberation chamber of claim 4, wherein the reflection plate has a shape of one of a curved surface and a bent surface to reflect an electromagnetic wave occurring in the transmitting and receiving antenna.

7. The reverberation chamber of claim 4, wherein a size of the reflection plate is greater than a size of one surface of the working volume.

8. A reverberation chamber comprising:
   a mode stirrer including a plurality of metal panels;
   transmitting and receiving antennas spaced apart by a predetermined distance from a working volume formed inside the reverberation chamber; and
   reflection plates disposed between the working volume and the transmitting and receiving antennas, wherein the reflection plates and the transmitting and receiving antennas are configured as pairs, respectively, each component of a pair being separated from each other, the pairs are spaced apart from one surface of the working volume,
   wherein the reflection plate is formed in consideration of an eigenmode distribution of the reverberation chamber with respect to an empty space in the reverberation chamber based on a location of the working volume,
   and the mode stirrer is at least one of:
      a columnar mode stirrer in which a plurality of metal panels having a dual structure between a ceiling and a floor of the reverberation chamber is arranged to be connected;
      a ceiling-type mode stirrer in which a plurality of metal panels having a dual structure between wall surfaces of the reverberation chamber is arranged to be connected;
      a pyramidal fixed mode stirrer located on a wall surface of the reverberation chamber; and
      an uneven fixed mode stirrer disposed on a wall surface of the reverberation chamber in parallel with the pyramidal fixed mode stirrer, the wall surface being different from the wall surface on which pyramidal fixed mode stirrer is located.

9. The reverberation chamber of claim 8, wherein the reflection plates are spaced apart from the one surface of the working volume by the same distance or different distances.

10. The reverberation chamber of claim 8, wherein the reflection plates are arranged on the same line in parallel, arranged to be offset from each other, arranged alternately, or arranged vertically with respect to the one surface of the working volume.

11. The reverberation chamber of claim 8, wherein the reflection plates are the same or different in size, and the reflection plates are greater or smaller in size than the one surface of the working volume.

12. A reverberation chamber comprising:
   a mode stirrer including a plurality of metal panels;
   transmitting and receiving antennas spaced apart by a predetermined distance from a working volume formed inside the reverberation chamber; and reflection plates disposed between the working volume and the transmitting and receiving antennas, wherein the reflection plates and the transmitting and receiving antennas are configured as pairs, respectively, each component of a pair being separated from each other, the pairs are spaced apart from at least two surfaces of the working volume, wherein the reflection plate is formed in consideration of an eigenmode distribution of the reverberation chamber with respect to an empty space in the reverberation chamber based on a location of the working volume, and the mode stirrer is at least one of:

- a columnar mode stirrer in which a plurality of metal panels having a dual structure between a ceiling and a floor of the reverberation chamber is arranged to be connected;
- a ceiling-type mode stirrer in which a plurality of metal panels having a dual structure between wall surfaces of the reverberation chamber is arranged to be connected;
- a pyramidal fixed mode stirrer located on a wall surface of the reverberation chamber; and
- an uneven fixed mode stirrer disposed on a wall surface of the reverberation chamber in parallel with the pyramidal fixed mode stirrer, the wall surface being different from the wall surface on which pyramidal fixed mode stirrer is located.

13. The reverberation chamber of claim 12, wherein the same number or different numbers of the reflection plates are arranged with respect to the at least two surfaces of the working volume.

14. The reverberation chamber of claim 12, wherein when the pairs are arranged on one surface of the working volume, the reflection plates are arranged on the same line in parallel, arranged to be offset from each other, arranged alternately, or arranged vertically.

15. The reverberation chamber of claim 12, wherein when the pairs are arranged on one surface of the working volume, the reflection plates are spaced apart from the one surface of the working volume by the same distance or different distances.

16. The reverberation chamber of claim 12, wherein the reflection plates are the same or different in size, and the reflection plates are greater or smaller in size than one surface of the working volume.

17. The reverberation chamber of claim 12, wherein the reflection plates have a shape of one of a curved surface and a bent surface to reflect an electromagnetic wave occurring in the transmitting and receiving antenna, or include a slot of a predetermined shape.

18. The reverberation chamber of claim 12, wherein a gradient at which the reflection plates are arranged in the reverberation chamber is adjusted based on the distribution of electromagnetic waves represented by the eigenmode of the reverberation chamber.

* * * * *